US012615977B2

(12) United States Patent
Gao et al.

(10) Patent No.: US 12,615,977 B2
(45) Date of Patent: Apr. 28, 2026

(54) CONFORMAL BORON DOPING METHOD FOR THREE-DIMENSIONAL STRUCTURE AND USE THEREOF

(71) Applicants: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

(72) Inventors: Jianfeng Gao, Beijing (CN); Shuai Yang, Beijing (CN); Jinbiao Liu, Beijing (CN); Weibing Liu, Beijing (CN); Junfeng Li, Beijing (CN); Jun Luo, Beijing (CN); Jinjuan Xiang, Beijing (CN)

(73) Assignees: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 395 days.

(21) Appl. No.: 18/398,558

(22) Filed: Dec. 28, 2023

(65) Prior Publication Data

US 2025/0149339 A1 May 8, 2025

(30) Foreign Application Priority Data

Nov. 2, 2023 (CN) .......................... 202311451207.6

(51) Int. Cl.
*H10P 32/10* (2026.01)
*H10P 32/14* (2026.01)
(Continued)

(52) U.S. Cl.
CPC ........ *H10P 32/171* (2026.01); *H10P 32/1412* (2026.01); *H10P 14/6339* (2026.01); *H10P 14/69391* (2026.01); *H10P 70/23* (2026.01)

(58) Field of Classification Search
CPC ............... H10P 32/171; H10P 32/1412; H10P 14/6339; H10P 14/69391
See application file for complete search history.

(56) References Cited

U.S. PATENT DOCUMENTS

| | | | | |
|---|---|---|---|---|
| 2012/0252197 A1* | 10/2012 | Clark | .................. | H10P 32/1408 438/561 |
| 2015/0079773 A1* | 3/2015 | Basker | .................... | H10P 10/00 438/510 |
| 2022/0199401 A1* | 6/2022 | Lin | ..................... | H10P 14/6939 |

* cited by examiner

*Primary Examiner* — Douglas M Menz
(74) *Attorney, Agent, or Firm* — Kinney & Lange, P.A.

(57) ABSTRACT

A conformal boron doping method for a three-dimensional structure includes the steps of: removing a natural oxide layer on a surface of a silicon-based three-dimensional substrate; forming a buffer layer on the surface of the silicon-based three-dimensional substrate; forming a boron oxide thin film on the alumina buffer layer; covering a passivation layer on a surface of the boron oxide thin film; and driving boron impurities containing boron oxide into the silicon-based three-dimensional substrate through the buffer layer by using laser or rapid annealing, to dope the silicon-based three-dimensional substrate. Selecting suitable boron source precursors and oxidants solves the problems of difficult nucleation and inability to form a film after reaching a certain thickness for boron oxide. By selecting alumina as the passivation layer, it is possible to protect the boron oxide thin film from being damaged, and thus achieve damage-free diffusion doping during laser or rapid annealing processes.

10 Claims, 4 Drawing Sheets

(51) Int. Cl.

| | | |
|---|---|---|
| *H10P 14/60* | (2026.01) | |
| *H10P 14/692* | (2026.01) | |
| *H10P 70/00* | (2026.01) | |

2

CONFORMAL BORON DOPING METHOD FOR THREE-DIMENSIONAL STRUCTURE AND USE THEREOF

CROSS-REFERENCE TO RELATED APPLICATION(S)

The present application claims priority to Chinese Application No. 202311451207.6 filed on Nov. 2, 2023, the contents of which are incorporated by reference herein in its entirety.

TECHNICAL FIELD

The present disclosure relates to the technical field of semiconductor preparation, in particular to a conformal boron doping method for a three-dimensional structure and use thereof.

BACKGROUND

With the continuous reduction of device size, in order to improve the performance and integration of semiconductor devices, new device structures such as FinFET, nanowires, and other three-dimensional (3D) structures have been applied to the preparation process of integrated circuit devices. This three-dimensional structure poses significant challenges to the traditional ultra-shallow silicon doping by ion injection. Therefore, it is necessary to develop new methods to replace the traditional ion injection doping processes so as to address the structural damage caused by ion injection technology, the channel effect of injection, and the injection shadow effect in three-dimensional structures.

In order to overcome the limitations of the traditional injection, some new doping methods are constantly being proposed. Among these, the plasma doping cannot completely avoid damage-related problems, including Transient Enhanced Diffusion (TED) during dopant activation; the Spin Dopant (SOD) technology cannot be directly applied to three-dimensional structures; and the monomolecule layer doping, BBr3 gas vapor phase doping or the like face the problem relating to the controlled deposition of a dopant source.

The atomic layer deposition technology has the characteristics of good conformability, uniformity, and atomic-scale thickness controllability because its growth mechanism is controlled by a self-limiting surface reaction. The ALD boron doping technology has the prospect for achieving uniform and conformal doping in three-dimensional nanoscale electronic devices.

At present, in the prior art, plasma-enhanced ALD is mainly used to deposit $B_2O_3$ for doping (U.S. Pat. No. 11,302,527B2). However, on the one hand, since boron oxide is very easy to absorb moisture, when $B_2O_3$ is exposed to ambient air and comes into contact with water vapor, it will degrade due to the formation of volatile $H_3BO_3$; on the other hand, the thermal ALD method of depositing boron oxide on a silicon surface has the problems of difficulty in nucleation and the inability to form a film after reaching a certain thickness.

Therefore, in the development of a process, it is not only necessary to select the suitable B source precursors and oxidants to solve the problem of controllable growth of the boron oxide film itself, but also to select a suitable stable surface passivation layer for in-situ deposition and protect $B_2O_3$ from being damaged, thereby achieving damage-free diffusion doping. In addition, because the plasma-enhanced ALD deposition method has the shadow effect in the deposition of three-dimensional structures, it cannot achieve conformal deposition, and there are further problems such as plasma damage or the like, so it cannot well satisfy the application needs of the devices.

In view of this, the present disclosure is proposed.

SUMMARY

A purpose of the present disclosure is to provide a conformal boron doping method for a three-dimensional structure and use thereof. This method not only solves the problem that the conformal deposition on a three-dimensional structure cannot be achieved by a plasma-enhanced atomic layer deposition method due to the shadow effect, but also solves the problems such as structural damage caused by plasma or the like.

The present disclosure provides a conformal boron doping method for a three-dimensional structure, characterized by comprising following steps of:

S1. removing an oxide layer on a surface of a silicon-based three-dimensional substrate;

S2. forming an alumina buffer layer on the surface of the silicon-based three-dimensional substrate;

S3. forming a boron oxide thin film on a surface of the alumina buffer layer at a side of the alumina buffer layer away from the silicon based three-dimensional substrate;

S4. covering an alumina passivation layer on a surface of the boron oxide thin film at a side of the boron oxide thin film away from the alumina buffer layer;

S5. driving boron impurities containing boron oxide into the silicon-based three-dimensional substrate through the buffer layer by using laser or rapid annealing, to dope the silicon-based three-dimensional substrate.

As the technical solution of the present disclosure, preferably, the Step S1 specifically comprises: firstly, removing the oxide layer on the silicon based three-dimensional substrate by using a dilute hydrofluoric acid (DHF) method; then, placing the silicon-based three-dimensional substrate in a chamber of an atomic deposition apparatus and vacuum pumping, wherein the chamber comprises a heater which is heated to a heater temperature of 35-40° C.; treating the silicon based three-dimensional substrate with a mixing gas of HF and NH3 for 20-40 s; heating the silicon based three-dimensional substrate to a temperature of 150-200° C., and baking it in a hydrogen atmosphere for 40-80 s to remove the oxide layer on the surface.

The ratio of hydrofluoric acid to water in DHF is 100:1. Due to its low concentration, its etching rate is very low and it may initially etch the natural oxide film on the wafer surface.

Further, the silicon-based three-dimensional substrate is placed in a chamber of an atomic deposition apparatus and the chamber is vacuumed; the heater of the chamber has a temperature of 35-40° C., and the substrate is treated with a mixing gas of HF and NH3 for 20-40 s; the temperature of the wafer is heated to a temperature of 150-200° C. and baked in a hydrogen atmosphere for 40-80 s which may remove the natural oxide layer on the surface. At the same time, it has a very high selectivity ratio for the silicon substrate and the SiN thin film. Then, the wafer is heated and baked to reduce impurities and defects on the surface of the wafer, to improve the surface fineness of the wafer, to improve the conductivity of the wafer, to reduce the concentration of impurities, and to increase electron mobility.

As the technical solution of the present disclosure, preferably, the Step S2 specifically comprises: transferring the silicon-based three-dimensional substrate in vacuum into a chamber of an atomic layer deposition apparatus, controlling the temperature of the chamber is controlled to be 80-150° C., injecting trimethyl aluminum is injected in a pulse manner for 0.1-0.5 s followed by vacuum pumping for 0.2-3 s, and then injecting ozone in a pulse manner for 0.2-3 s followed by vacuum pumping for 0.2-3 s, to form the alumina buffer layer on the surface of the silicon-based three-dimensional substrate.

After removing the natural oxide on the surface of the silicon-based three-dimensional substrate, a buffer layer is further deposited on the surface of the silicon-based three-dimensional substrate so that the nucleation and deposition of boron oxide may be achieved on the surface of the wafer. The material of the buffer layer of the present disclosure is specifically alumina. The material using alumina as the buffer layer has the ability of treating the surface of an extremely thin single atomic layer to achieve the deposition of boron oxide without hindering the diffusion ability of B atoms during subsequent annealing.

As the technical solution of the present disclosure, preferably, the Step S3 specifically comprises: in a chamber of the atomic layer deposition apparatus, injecting trimethyl borate in situ in a pulse manner for 0.1-0.5 s followed by vacuum pumping for 0.2-3 s, and then injecting ozone in a pulse manner for 0.5-3 s followed by vacuum pumping for 0.2-3 s; performing processing for 10-20 cycles, to form the boron oxide thin film on the surface of the alumina buffer layer at the side of the alumina buffer layer away from the silicon-based three-dimensional substrate.

In the present disclosure, by using trimethyl borate as a boron source precursor and using ozone as an oxidant, the problems of difficult nucleation and inability to form a film after reaching a certain thickness involved in the thermal ALD method for depositing boron oxide on the silicon surface are effectively solved.

In order to further protect the boron oxide thin film from being damaged, the present disclosure further covers the surface of the boron oxide thin film with an alumina passivation layer. The specific method comprises as follows: in a chamber of the atomic layer deposition apparatus, injecting trimethyl aluminum in situ in a pulse manner for 0.1-0.15 s followed by vacuum pumping for 0.5-2 s, and injecting ozone in a pulse manner for 0.5-2 s followed by vacuum pumping for 0.5-3 s; performing processing for 3-5 cycles, to achieve a stable passivation layer with a certain thickness.

As the technical solution of the present disclosure, preferably, before the Step S4, depending on the three-dimensional structure and doping requirements, the Steps S2 and S3 may be alternately repeated.

As the technical solution of the present disclosure, preferably, in the Step S5, when using laser annealing, the wavelength range is 308 nm-10.6 μm, the energy density is 200 mj/cm²-2 j/cm², the annealing temperature is 900-1100° C., and the annealing time is 10 ns-1 ms; and when using rapid annealing, the heating rate is greater than 250° C./s and the annealing time is 5-30 s.

During the laser annealing, a high-energy laser beam is used to irradiate the wafer rapidly. The wafer absorbs the laser energy and converts it into thermal energy, causing the wafer to heat up rapidly locally to a high temperature, allowing boron atoms to diffuse in the lattice and occupy the alternative positions to achieve activation. During the subsequent rapid cooling process, the atoms in the lattice are rearranged, thereby realizing the doping of the silicon substrate with boron impurities, so as to obtain highly precise doping activation and defect reparation.

After driving the boron impurities containing boron oxide through the buffer layer into the silicon substrate by using laser or rapid annealing, a hydrofluoric acid solution is further used to remove the remaining boron oxide and alumina thin film. The present disclosure does not strictly limit the concentration of the hydrofluoric acid solution, and hydrofluoric acid with an appropriate concentration may be selected for etching according to requirements.

In a second aspect, the present disclosure further discloses the specific use of the above conformal boron doping method for a three-dimensional structure in an ultra-shallow silicon doping preparation process for an integrated circuit device having a three-dimensional structure, which should also belong to the protection scope of the present disclosure.

Among them, the three-dimensional structure includes but is not limited to any one of Fin Field Effect Transistor (FinFET) and Gate All Around Field Effect Transistor (GAA-FET).

The conformal boron doping method for a three-dimensional structure of the present disclosure has at least the following beneficial effects.

In the present disclosure, an alumina buffer layer is firstly formed on the surface of a silicon-based three-dimensional substrate. Then, a boron oxide thin film is formed on the alumina buffer layer by using thermal atomic layer deposition technology. Then the surface of the boron oxide thin film is covered with an alumina passivation layer. Finally, the boron impurities in the boron oxide are driven through the buffer layer into the silicon-based three-dimensional substrate by using laser or annealing, to dope the silicon-based three-dimensional substrate. Finally, the boron doping of boron on a three-dimensional structure was achieved. According to this method, on the one hand, by selecting suitable boron source precursors and oxidants, the problems of difficult nucleation and inability to form a film after reaching a certain thickness of boron oxide have been solved, and on the other hand, by selecting alumina as the passivation layer, it is possible to protect the boron oxide thin film from being damaged, and thus achieve damage-free diffusion doping during laser or rapid annealing processes. Thus, this present disclosure not only solves the problem that the conformal deposition on a three-dimensional structure cannot be achieved by a plasma-enhanced atomic layer deposition method due to the shadow effect, but also solves the problems such as structural damage caused by plasma or the like.

BRIEF DESCRIPTION OF THE DRAWINGS

In order to more clearly explain the specific embodiments of the present disclosure or the technical solutions in the prior art, the drawings used in the description of the specific implementations or the prior art will be briefly introduced below. Obviously, the drawings in the following description are some embodiments of the present disclosure, and for those of ordinary skill in the art, other drawings may also be obtained based on these drawings without exerting creative efforts.

DETAILED DESCRIPTION OF EMBODIMENTS

Figure 1:
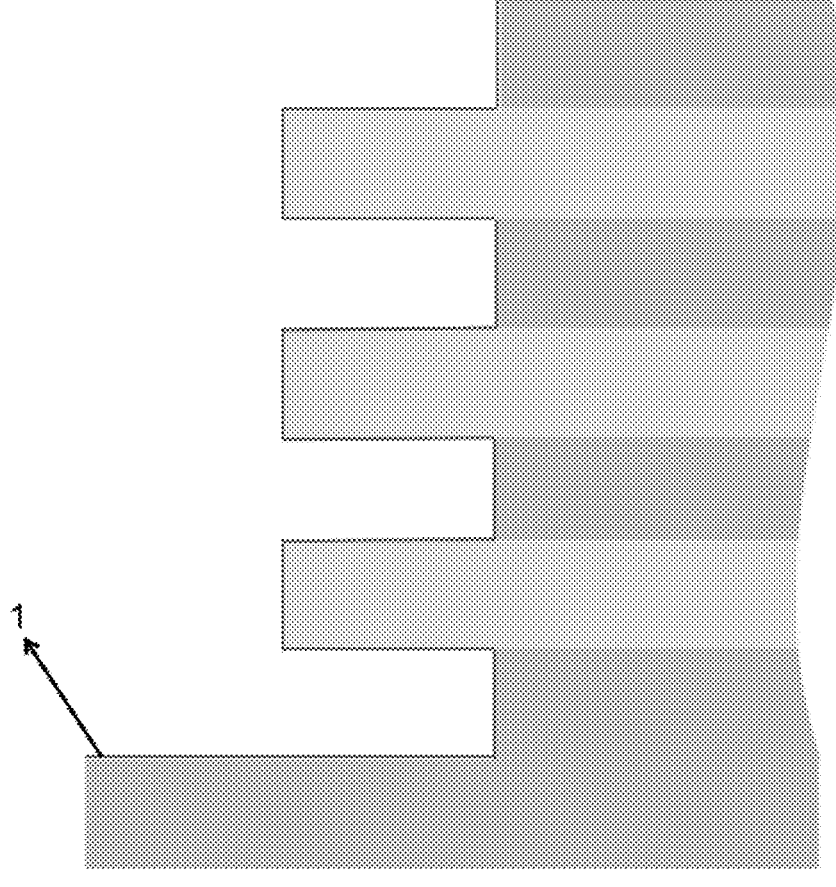
FIG. 1 shows the formation of an alumina buffer layer on the surface of the silicon-based three-dimensional substrate according to the present disclosure.
Figure 2:
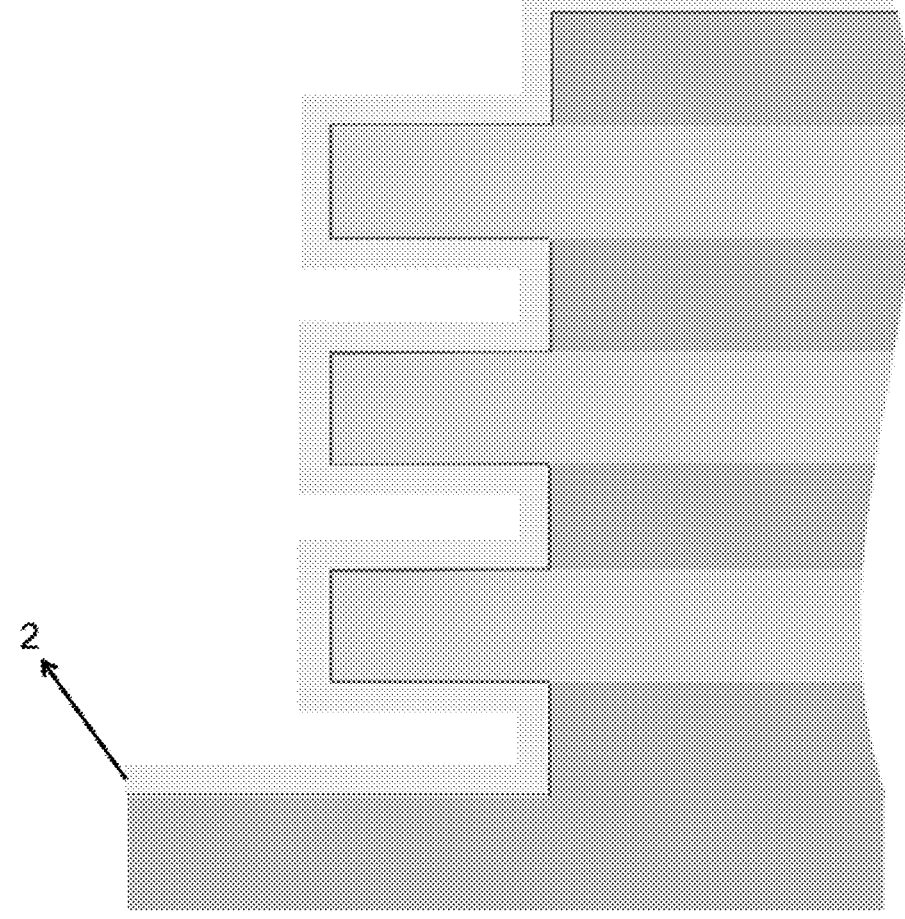
FIG. 2 shows the formation of a boron oxide thin film on a surface of the alumina buffer layer at a side of the alumina buffer layer away from the silicon based three-dimensional substrate according to the present disclosure.
Figure 3:
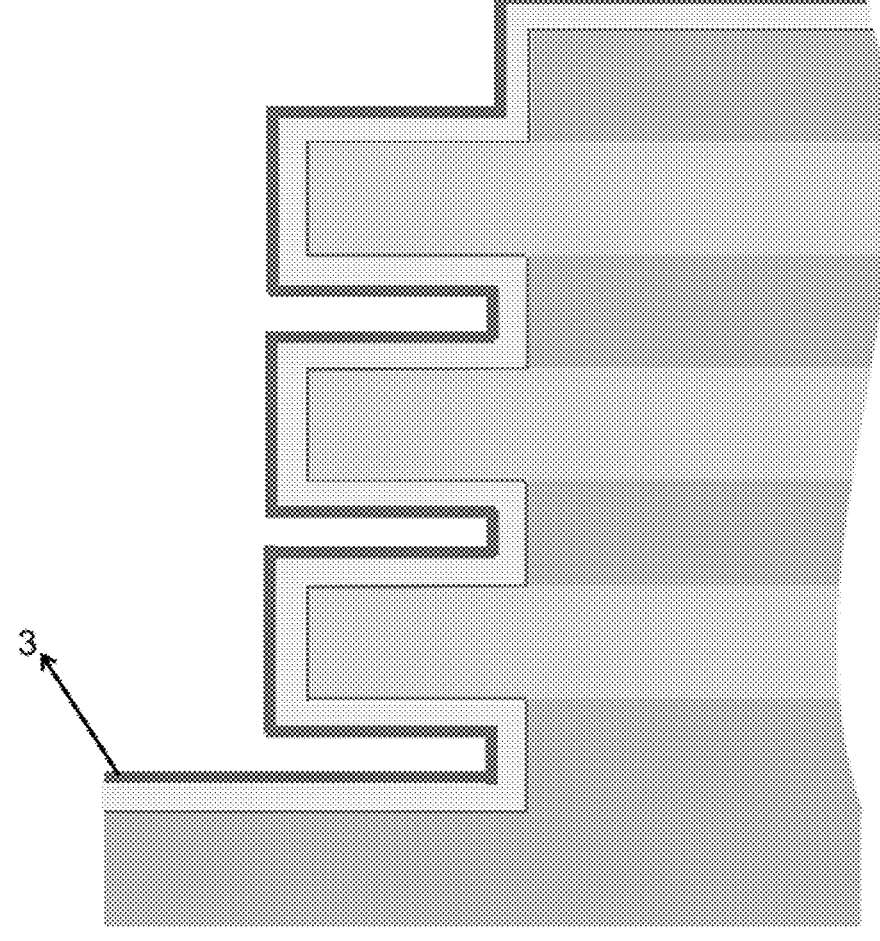
FIG. 3 shows the coverage of an alumina passivation layer on a surface of the boron oxide thin film at a side of the boron oxide thin film away from the alumina buffer layer according to the present disclosure.

It should be noted that the following detailed description is illustrative and is intended to provide further explanation of the present disclosure. Unless otherwise defined, all technical and scientific terms used herein have the same meanings commonly understood by one of ordinary skill in the art to which this application belongs.

It should be noted that the terms used herein are only for describing specific embodiments and are not intended to limit the exemplary embodiments according to the present application. As used herein, the singular form also includes the plural form unless the context clearly indicates otherwise. Furthermore, it should also be understood that when the terms "comprise" and/or "include" are used in this specification, they indicate the presence of features, steps, operations, devices, components and/or combinations thereof.

The technical solution of the present disclosure will be clearly and completely described below with reference to the examples. Obviously, the described examples are some, but not all, of the examples of the present disclosure. Based on the examples of the present disclosure, all other examples obtained by those of ordinary skill in the art without creative efforts It should be noted that the terms used herein are only for describing specific embodiments and are not intended to limit the exemplary embodiments according to the present application. As used herein, the singular form also includes the plural form unless the context clearly indicates otherwise. Furthermore, it should also be understood that when the terms "comprise" and/or "include" are used in this specification, they indicate the presence of features, steps, operations, devices, components and/or combinations thereof. fall within the scope of the protection of the present disclosure.

Example 1

S11: Firstly, the oxide layer on the silicon based three-dimensional substrate was removed by using a solution of hydrofluoric acid and water in a ratio of 100:1. Then, the silicon-based three-dimensional substrate was placed in a chamber of an atomic deposition apparatus and the process chamber was vacuumed. The chamber comprised a heater, and the chamber heater temperature was controlled to 35° C. The silicon based three-dimensional substrate was treated with a mixing gas of HF and NH3 for 30 s. The silicon based three-dimensional substrate was heated to a temperature of 180° C. and baked for 1 min to remove the oxide layer on the surface.

S12: The silicon-based three-dimensional substrate was transferred in vacuum into a chamber of an atomic layer deposition apparatus. The temperature of the chamber was controlled to be 120° C. Trimethyl aluminum was injected in a pulse manner for 0.3 s (with a source temperature of 21° C.) followed by vacuum pumping for 2 s, and then ozone was injected in a pulse manner for 2 s followed by vacuum pumping for 2 s, and the alumina buffer layer was formed on the surface of the silicon-based three-dimensional substrate.

S13: In a chamber of the atomic layer deposition apparatus, trimethyl borate was injected in situ in a pulse manner for 0.3 s (with a source temperature of 21° C.) followed by vacuum pumping for 2 s, and then ozone was injected in a pulse manner for 2 s followed by vacuum pumping for 2 s. The above processing was performed for 15 cycles to form the boron oxide thin film on the surface of the alumina buffer layer at the side of the alumina buffer layer away from the silicon-based three-dimensional substrate.

S14: In a chamber of the atomic layer deposition apparatus, trimethyl aluminum was injected in situ in a pulse manner for 0.125 s (with a source temperature of 21° C.) followed by vacuum pumping for 1 s, and ozone was injected in a pulse manner for 1 s followed by vacuum pumping for 2 s. The above processing was performed for 4 cycles to cover the alumina passivation layer on the surface of the boron oxide thin film at a side of the boron oxide thin film away from the alumina buffer layer.

S15: Boron impurities containing boron oxide were driven into the silicon-based three-dimensional substrate through the buffer layer to dope the silicon-based three-dimensional substrate by using laser annealing and controlling the wavelength range to 308 nm-10.6 μm, the energy density to 1 j/cm$^2$, the annealing temperature to 1000° C., and the annealing time to 500 ns.

S16: The residual boron oxide and the alumina thin film were removed by using a hydrofluoric acid solution.

Example 2

S21: Firstly, the oxide layer on the silicon based three-dimensional substrate was removed by using a solution of hydrofluoric acid and water in a ratio of 100:1. Then, the silicon-based three-dimensional substrate was placed in a chamber of an atomic deposition apparatus and the chamber was vacuumed. The chamber comprised a heater, and the chamber heater temperature was controlled to 35° C. The silicon based three-dimensional substrate was treated with a mixing gas of HF and NH3 for 20 s. The silicon based three-dimensional substrate was heated to a temperature of 200° C. and baked for 40 s to remove the natural oxide layer on the surface.

S22: The silicon-based three-dimensional substrate was transferred in vacuum into a chamber of an atomic layer deposition apparatus. The temperature of the chamber was controlled to be 80° C. Trimethyl aluminum was injected in a pulse manner for 0.5 s (with a source temperature of 21° C.) followed by vacuum pumping for 0.2 s, and then ozone was injected in a pulse manner for 0.2 s followed by vacuum pumping for 0.2 s, and the alumina buffer layer was formed on the surface of the silicon-based three-dimensional substrate.

S23: In a chamber of the atomic layer deposition apparatus, trimethyl borate was injected in situ in a pulse manner for 0.1 s (with a source temperature of 21° C.) followed by vacuum pumping for 0.2 s, and then ozone was injected in a pulse manner for 0.5 s followed by vacuum pumping for 0.2 s. The above processing was performed for 20 cycles to form the boron oxide thin film on the surface of the alumina buffer layer at the side of the alumina buffer layer away from the silicon-based three-dimensional substrate.

S24: In a chamber of the atomic layer deposition apparatus, trimethyl aluminum was injected in situ in a pulse manner for 0.1 s (with a source temperature of 21° C.) followed by vacuum pumping for 0.5 s, and ozone was injected in a pulse manner for 0.5 s followed by vacuum pumping for 1 s. The above processing was performed for 5 cycles to cover the alumina passivation layer on the surface of the boron oxide thin film at a side of the boron oxide thin film away from the alumina buffer layer.

S25: Boron impurities containing boron oxide were driven into the silicon-based three-dimensional substrate through the buffer layer to dope the silicon-based three-dimensional substrate by using laser annealing and controlling the wavelength range to 308 nm-10.6 μm, the energy density to 2 j/cm$^2$, the annealing temperature to 900° C., and the annealing time to 1 ms.

S26: The residual boron oxide and the alumina thin film were removed by using a hydrofluoric acid solution.

Example 3

S31: Firstly, the oxide layer on the silicon based three-dimensional substrate was removed by using a solution of hydrofluoric acid and water in a ratio of 100:1. Then, the silicon-based three-dimensional substrate was placed in a chamber of an atomic deposition apparatus and the chamber was vacuumed. The chamber comprised a heater, and the chamber heater temperature was controlled to 35° C. The silicon based three-dimensional substrate was treated with a mixing gas of HF and NH3 for 40 s. The silicon based three-dimensional substrate was heated to a temperature of 150° C. and baked for 80 s to remove the natural oxide layer on the surface.

S32: The silicon-based three-dimensional substrate was transferred in vacuum into a chamber of an atomic layer deposition apparatus. The temperature of the chamber was controlled to be 150° C. Trimethyl aluminum was injected in a pulse manner for 0.5 s (with a source temperature of 21° C.) followed by vacuum pumping for 3 s, and then ozone was injected in a pulse manner for 3 s followed by vacuum pumping for 3 s, and the alumina buffer layer was formed on the surface of the silicon-based three-dimensional substrate.

S33: In a chamber of the atomic layer deposition apparatus, trimethyl borate was injected in situ in a pulse manner for 0.5 s (with a source temperature of 21° C.) followed by vacuuming for 3 s, and then ozone was injected in a pulse manner for 3 s followed by vacuuming for 3 s. The above processing was performed for 10 cycles to form the boron oxide thin film on the surface of the alumina buffer layer at the side of the alumina buffer layer away from the silicon-based three-dimensional substrate.

S34: In a chamber of the atomic layer deposition apparatus, trimethyl aluminum was injected in situ in a pulse manner for 0.15 s (with a source temperature of 21° C.) followed by vacuum pumping for 2 s, and ozone was injected in a pulse manner for 2 s followed by vacuum pumping for 3 s. The above processing was performed for 3 cycles to cover the alumina passivation layer on the surface of the boron oxide thin film at a side of the boron oxide thin film away from the alumina buffer layer.

S35: Boron impurities containing boron oxide were driven into the silicon-based three-dimensional substrate through the buffer layer to dope the silicon-based three-dimensional substrate by using rapid annealing and controlling the heating rate to 300° C./s and the annealing time to 20 s.

S36: The residual boron oxide and the alumina thin film were removed by using a hydrofluoric acid solution.

Example 4

S41: Firstly, the oxide layer on the silicon based three-dimensional substrate was removed by using a solution of hydrofluoric acid and water in a ratio of 100:1. Then, the silicon-based three-dimensional substrate was placed in a chamber of an atomic deposition apparatus and the chamber was vacuumed. The chamber comprised a heater, and the chamber heater temperature was controlled to 35° C. The silicon based three-dimensional substrate was treated with a mixing gas of HF and NH3 for 30 s. The silicon based three-dimensional substrate was heated to a temperature of 180° C. and baked for 1 min to remove the natural oxide layer on the surface.

S42: The silicon-based three-dimensional substrate was transferred in vacuum into a chamber of an atomic layer deposition apparatus. The temperature of the chamber was controlled to be 110° C. Trimethyl aluminum was injected in a pulse manner for 0.2 s (with a source temperature of 21° C.) followed by vacuum pumping for 1 s, and then ozone was injected in a pulse manner for 1 s followed by vacuum pumping for 1 s, and the alumina buffer layer was formed on the surface of the silicon-based three-dimensional substrate.

S43: In a chamber of the atomic layer deposition apparatus, trimethyl borate was injected in situ in a pulse manner for 0.3 s (with a source temperature of 21° C.) followed by vacuum pumping for 1 s, and then ozone was injected in a pulse manner for 1 s followed by vacuum pumping for 1 s. The above processing was performed for 12 cycles to form the boron oxide thin film on the surface of the alumina buffer layer at the side of the alumina buffer layer away from the silicon-based three-dimensional substrate.

S44: In a chamber of the atomic layer deposition apparatus, trimethyl aluminum was injected in situ in a pulse manner for 0.12 s (with a source temperature of 21° C.) followed by vacuum pumping for 1 s, and ozone was injected in a pulse manner for 1 s followed by vacuum pumping for 1 s. The above processing was performed for 3 cycles to cover the alumina passivation layer on the surface of the boron oxide thin film at a side of the boron oxide thin film away from the alumina buffer layer.

S45: Boron impurities containing boron oxide were driven into the silicon-based three-dimensional substrate through the buffer layer to dope the silicon-based three-dimensional substrate by using rapid annealing and controlling the heating rate to 300° C./s and the annealing time to 30s.

S46: The residual boron oxide and the alumina thin film were removed by using a hydrofluoric acid solution.

Figure 4:
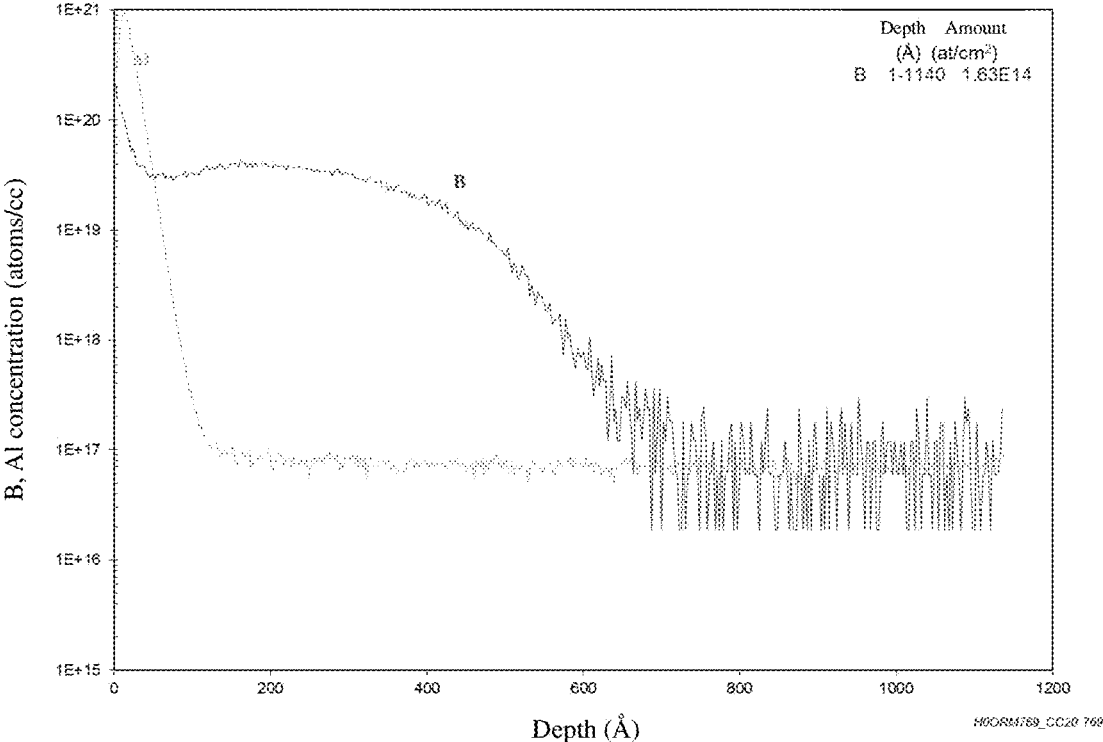
FIG. 4 is a graph showing the test results of B doping concentration according to the present disclosure.

In the present disclosure, the doping concentration in the three-dimensional structure doped with boron prepared in Example 1 was measured, and the test results are shown in FIG. 4.

It can be seen from FIG. 4 that the B doping concentration of doping method according to the present disclosure may reach 3 E+19, which is close to the doping technology of plasma-enhanced ALD deposition of B$_2$O$_3$ and avoids damage to the device by plasma during the deposition process.

Finally, it should be noted that the above examples are only used to illustrate the technical solution of the present disclosure, but not to limit it. Although the present disclosure has been described in detail with reference to the foregoing examples, those of ordinary skill in the art should understand that they may still modify the technical solutions recorded in the foregoing examples, or make equivalent substitutions for some or all of the technical features. In addition, these modifications or substitutions do not cause the essence of the corresponding technical solution to depart from the scope of the technical solution of each example of the present disclosure.

What is claimed is:

1. A conformal boron doping method for a three-dimensional structure, the method comprising the following steps:

S1. removing an oxide layer on a surface of a silicon-based three-dimensional substrate;

S2. forming an alumina buffer layer on the surface of the silicon-based three-dimensional substrate;

S3. forming a boron oxide thin film on a surface of the alumina buffer layer at a side of the alumina buffer layer away from the silicon based three-dimensional substrate;

S4. covering an alumina passivation layer on a surface of the boron oxide thin film at a side of the boron oxide thin film away from the alumina buffer layer; and S5. driving boron impurities containing boron oxide into the silicon-based three-dimensional substrate through the buffer layer by using laser or rapid annealing, to dope the silicon-based three-dimensional substrate.

2. The conformal boron doping method for a three-dimensional structure according to claim 1, wherein the Step S1 specifically comprises:

firstly, removing the oxide layer on the silicon based three-dimensional substrate by using a dilute hydrofluoric acid (DHF) method;

then, placing the silicon-based three-dimensional substrate in a chamber of an atomic deposition apparatus and vacuum pumping, wherein the chamber comprises a heater which is heated to a heater temperature of 35-40° C.;

treating the silicon based three-dimensional substrate with a mixing gas of HF and $NH_3$ for 20-40 s; and heating the silicon based three-dimensional substrate to a temperature of 150-200° C., and baking it in a hydrogen atmosphere for 40-80 s to remove the oxide layer on the surface.

3. The conformal boron doping method for a three-dimensional structure according to claim 1, wherein the Step S2 specifically comprises:

transferring the silicon-based three-dimensional substrate in vacuum into a chamber of an atomic layer deposition apparatus, controlling the temperature of the chamber to be 80-150° C., injecting trimethyl aluminum in a pulse manner for 0.1-0.5 s followed by vacuum pumping for 0.2-3 s, and then injecting ozone in a pulse manner for 0.2-3 s followed by vacuum pumping for 0.2-3 s, to form the alumina buffer layer on the surface of the silicon-based three-dimensional substrate.

4. The conformal boron doping method for a three-dimensional structure according to claim 1, wherein the Step S3 specifically comprises:

in a chamber of the atomic layer deposition apparatus, injecting trimethyl borate in situ in a pulse manner for 0.1-0.5 s followed by vacuum pumping for 0.2-3 s, and then injecting ozone in a pulse manner for 0.5-3 s followed by vacuum pumping for 0.2-3 s; and performing processing for 10-20 cycles, to form the boron oxide thin film on the surface of the alumina buffer layer at the side of the alumina buffer layer away from the silicon-based three-dimensional substrate.

5. The conformal boron doping method for a three-dimensional structure according to claim 1, wherein the Step S4 specifically comprises:

in a chamber of the atomic layer deposition apparatus, injecting trimethyl aluminum in situ in a pulse manner for 0.1-0.15 s followed by vacuum pumping for 0.5-2 s, and injecting ozone in a pulse manner for 0.5-2 s followed by vacuum pumping for 0.5-3 s; and performing processing for 3-5 cycles, to cover the alumina passivation layer on the surface of the boron oxide thin film at a side of the boron oxide thin film away from the alumina buffer layer.

6. The conformal boron doping method for a three-dimensional structure according to claim 1, wherein before the Step S4, depending on doping requirements, the Steps S2 and S3 are repeatable.

7. The conformal boron doping method for a three-dimensional structure according to claim 1, wherein in the Step S5, when using laser annealing, the wavelength range is 308 nm-10.6 μm, the energy density is 200 mj/cm²-2 j/cm², the annealing temperature is 900-1100° C., and the annealing time is 10 ns-1 ms; and wherein:

when using rapid annealing, the heating rate is greater than 250° C./s and the annealing time is 5-30 s.

8. The conformal boron doping method for a three-dimensional structure according to claim 1, wherein the method further comprises the following step:

S6. removing residual boron oxide and alumina thin films by using a hydrofluoric acid solution.

9. Use of a conformal boron doping method for a three-dimensional structure, characterized by applying the conformal boron doping method for a three-dimensional structure according to claim 1 to an ultra-shallow silicon doping preparation process for an integrated circuit device having a three-dimensional structure.

10. The use according to claim 9, wherein the three-dimensional structure comprises a FinFET or a GAA-FET.

* * * * *